(12) United States Patent
Mathijssen et al.

(10) Patent No.: US 10,386,735 B2
(45) Date of Patent: Aug. 20, 2019

(54) LITHOGRAPHIC APPARATUS ALIGNMENT SENSOR AND METHOD

(71) Applicant: ASML Netherlands B.V., Veldhoven (NL)

(72) Inventors: Simon Gijsbert Josephus Mathijssen, Rosmalen (NL); Arie Jeffrey Den Boef, Waalre (NL); Nitesh Pandey, Eindhoven (NL); Patricius Aloysius Jacobus Tinnemans, Hapert (NL); Stefan Michiel Witte, Hoofddorp (NL); Kjeld Sijbrand Eduard Eikema, Hoofddorp (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/754,470

(22) PCT Filed: Aug. 22, 2016

(86) PCT No.: PCT/EP2016/069776
§ 371 (c)(1),
(2) Date: Feb. 22, 2018

(87) PCT Pub. No.: WO2017/036833
PCT Pub. Date: Mar. 9, 2017

(65) Prior Publication Data
US 2018/0246423 A1 Aug. 30, 2018

(30) Foreign Application Priority Data
Aug. 28, 2015 (EP) .................................... 15183058

(51) Int. Cl.
G03F 9/00 (2006.01)
G03F 7/20 (2006.01)
(Continued)

(52) U.S. Cl.
CPC .......... *G03F 9/7003* (2013.01); *G01B 11/272* (2013.01); *G03F 9/7046* (2013.01);
(Continued)

(58) Field of Classification Search
CPC .... G03F 9/7003; G03F 9/7046; G03F 9/7088; G03F 9/7092; G06T 7/73
See application file for complete search history.

(56) References Cited

U.S. PATENT DOCUMENTS 5,822,066 A 10/1998 Jeong et al.
6,628,392 B2 9/2003 Kuroda et al.
(Continued)

FOREIGN PATENT DOCUMENTS

JP H03-67104 A 3/1991
JP 2002-062489 A 2/2002
(Continued)

OTHER PUBLICATIONS

International Search Report on Written Opinion of the International Searching Authority directed to related International Patent Application No. PCT/EP2016/069776, dated Nov. 30, 2016; 10 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

A lithographic apparatus comprises comprise a substrate table constructed to hold a substrate; and a sensor configured to sense a position of an alignment mark provided onto the substrate held by the substrate table. The sensor comprises a source of radiation configured to illuminate the alignment mark with a radiation beam, a detector configured to detect the radiation beam, having interacted with the alignment mark, as an out of focus optical pattern, and a data processing system. The data processing system is configured to
(Continued)

receive image data representing the out of focus optical pattern, and process the image data for determining alignment information, comprising applying a lensless imaging algorithm to the out of focus optical pattern.

16 Claims, 8 Drawing Sheets

(51) Int. Cl.
    *G06T 7/73*           (2017.01)
    *G01B 11/27*       (2006.01)

(52) U.S. Cl.
    CPC .......... *G03F 9/7088* (2013.01); *G03F 9/7092* (2013.01); *G06T 7/73* (2017.01)

(56) References Cited

U.S. PATENT DOCUMENTS

| | | |
|---|---|---|
| 6,833,309 B2 | 12/2004 | Fukuda |
| 8,031,337 B2 | 10/2011 | Den Boef |
| 9,303,978 B2 | 4/2016 | Den Boef |
| 2008/0069430 A1 | 3/2008 | Setija et al. |
| 2009/0097008 A1 | 4/2009 | Mos et al. |
| 2011/0149062 A1 | 6/2011 | Campidell et al. |

FOREIGN PATENT DOCUMENTS

| | | |
|---|---|---|
| JP | 2003-224057 A | 8/2003 |
| JP | 2005-079249 A | 3/2005 |
| JP | 2007-281384 A | 10/2007 |
| JP | 2008-263187 A | 10/2008 |
| JP | 2009-094512 A | 4/2009 |
| JP | 2012-175103 A | 9/2012 |
| JP | 2013-113766 A | 6/2013 |
| JP | 2013-115317 A | 6/2013 |
| WO | WO 2010/149403 A1 | 12/2010 |
| WO | WO 2014/019846 A1 | 2/2014 |
| WO | WO 2014/033459 A1 | 3/2014 |

OTHER PUBLICATIONS

International Preliminary Report on Patentability directed to related International Patent Application No. PCT/EP2016/069776, dated Mar. 6, 2018; 7 pages.
Wyant J.C., "Phase-Shifting Interferometry," Optics, 2011; 35 pages.
Japanese Notice of Reasons for Refusal with English-language Translation attached directed to related Japanese Patent Publication No. JP 2018527630 A, dated Apr. 16, 2019; 14 pages.

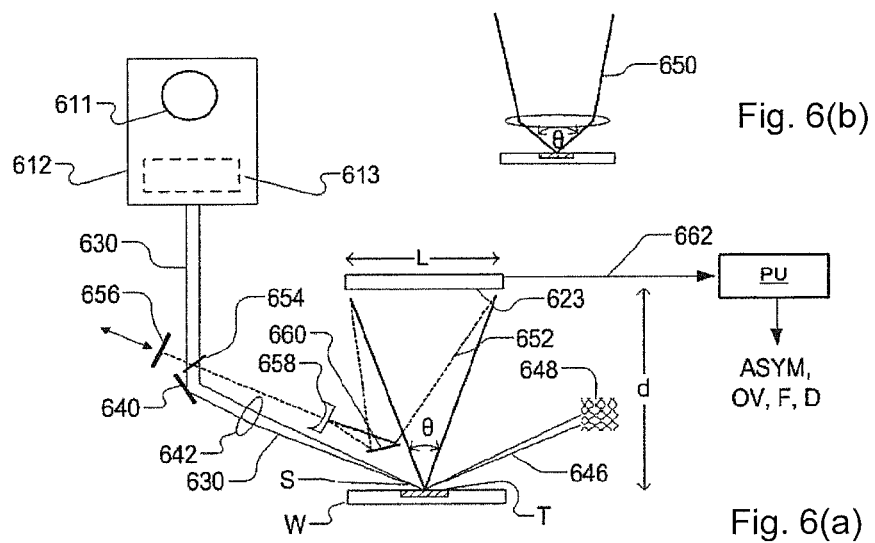
Fig. 6(b)
Fig. 6(a)
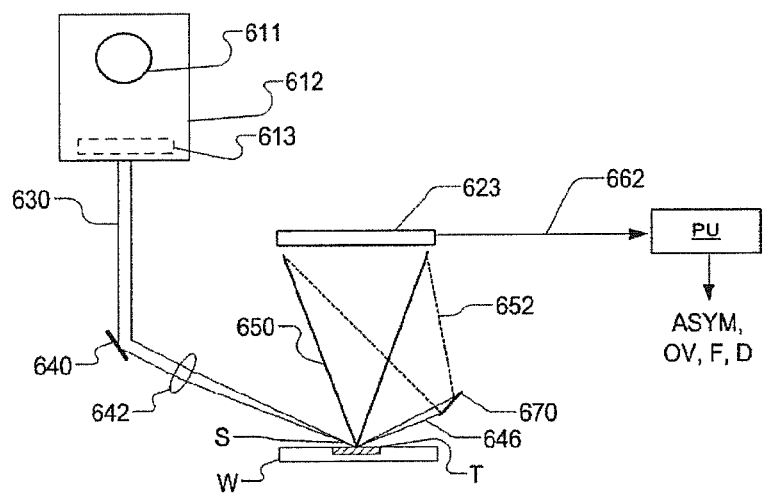
Fig. 7

LITHOGRAPHIC APPARATUS ALIGNMENT SENSOR AND METHOD

CROSS-REFERENCE TO RELATED APPLICATIONS

This application claims priority of EP application 15183058.5 which was filed on 28 Aug. 2015 and which is incorporated herein in its entirety by reference.

FIELD

The present invention relates to a lithographic apparatus having an alignment sensor and to a lithographic alignment method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, plural patterns are projected onto a substrate, e.g. in order to enable manufacturing complex semiconductor structures. These plural patterns are projected consecutively onto the substrate. In order to be able to manufacture patterns at a complexity and small dimensions, a high accuracy of overlay of the patterns is required. In order to reduce so called overlay errors, a plurality of techniques are applied including an alignment of the substrate. In order to align the substrate, alignment measurements are performed by an alignment sensor. The alignment sensor essentially measures a position of one of more known references that are provided on the substrate, the known reference(s) e.g. comprising known patterns such as alignment reference patterns.

In lithography processes, manufacturing cost and its reduction may play a relevant role. As a result, a designer of substrate (e.g. semiconductor) structures aims to obtain a large usable area on a substrate, so as to get as many resulting products from one substrate as possible, thereby to sacrifice a part of the surface of the substrate as small as possible. Alignment marks are generally placed next to usable areas, i.e. next to (e.g. semiconductor structure) patterns on the surface of the substrate, also referred to as target portions. In order to be able to provide a high alignment accuracy and increase a net yield per substrate, a tendency may be observed to provide alignment marks in the patterns on the substrate, e.g. in a lower layer, whereby successive layers on top of the alignment mark provide (e.g. semiconductor) structures. Thus, further layers may be provided on top of the alignment mark, thus using the available substrate surface efficiently. Thereby, a usable space of the substrate surface is increased, and substrate surface that is used for "overhead" purposes only, such as the provision of reference alignment marks, is reduced. Given high overlay requirements, a desire for a large number of alignment marks to be provided on the substrate surface and distributed over the substrate surface, may come into existence. A tendency is observed that the number of layers to be provided onto the substrate tends to increase, causing the number of lithographic patterns to be successively projected onto the substrate, to increase. Due to the fact that a large number of layers may be provided onto the substrate, such alignment mark may be hidden by plural layers provided on top of it during operational use of the lithographic apparatus.

SUMMARY

According to an aspect of the invention, there is provided a lithographic apparatus comprising:
  a substrate table constructed to hold a substrate; and
  a sensor configured to sense a position of an alignment mark provided onto the substrate held by the substrate table,
    wherein the sensor comprises
    a source of radiation configured to illuminate the alignment mark with a radiation beam,
    a detector configured to detect the radiation beam, having interacted with the alignment mark, as an out of focus optical pattern, and
    a data processing system configured to
    receive image data representing the out of focus optical pattern, and
    process the image data for determining alignment information, comprising applying a lensless imaging algorithm to the out of focus optical pattern.

According to another aspect of the invention, there is provided a lithographic alignment method comprising:
  providing a substrate having an alignment mark,
  emitting a radiation beam onto the alignment mark,
  detecting by a detector the radiation beam having interacted with the alignment mark, wherein the radiation beam having interacted with the alignment mark is projected onto the detector as an out of focus optical pattern,
  receiving, from the detector, image data representing the out of focus optical pattern, and
  processing the image data for determining alignment information, comprising applying a lensless imaging algorithm to the out of focus optical pattern.

According to yet another aspect of the invention, there is provided a data processing system comprising a data input for receiving, from a detector, an out of focus optical pattern, the out of focus optical pattern from a radiation beam having interacted with an alignment mark, the data processing system being configured to:
  receive at the data input image data representing the out of focus optical pattern, and
  process the image data for determining alignment information, comprising applying a lensless imaging algorithm to the out of focus optical pattern.

According to a further aspect of the invention, there is provided a control software for being executed by a data processing system, the control software being configured to:

receive image data representing an out of focus optical pattern, the out of focus optical pattern from a radiation beam having interacted with an alignment mark and process the image data for determining alignment information, comprising applying a lensless imaging algorithm to the out of focus optical pattern.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6(a)-6(b) depict a highly schematic view of a still further alignment sensor;

FIG. 7 depicts a highly schematic view of a yet still further alignment sensor.

DETAILED DESCRIPTION

Figure 1:
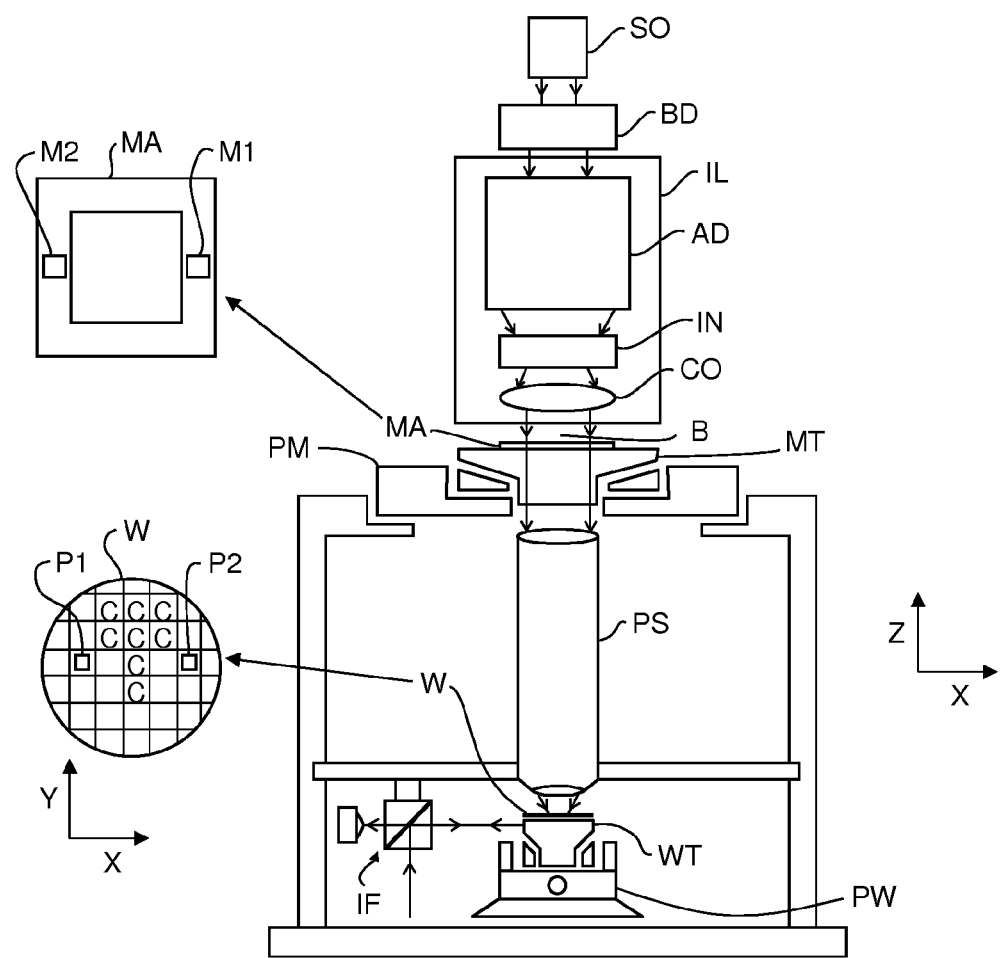
FIG. 1 depicts a lithographic apparatus according to in which the invention may be embodied.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. This technique is known as Optical Proximity Correction (OPC). Optical proximity correction (OPC) is a photolithography enhancement technique commonly used to compensate for image errors due to diffraction or process effects. The need for OPC is seen mainly in the making of semiconductor devices and is due to the limitations of light to maintain the edge placement integrity of the original design, after processing, into the etched image on the silicon wafer. These projected images appear with irregularities such as line widths that are narrower or wider than designed, these are amenable to compensation by changing the pattern on the photomask used for imaging. Other distortions such as rounded corners are driven by the resolution of the optical imaging tool and are harder to compensate for. Such distortions, if not corrected for, may significantly alter the electrical properties of what was being fabricated. Optical Proximity Correction corrects these errors by moving edges or adding extra polygons to the pattern written on the photomask. This may be driven by pre-computed look-up tables based on width and spacing between features (known as rule based OPC) or by using compact models to dynamically simulate the final pattern and thereby drive the movement of edges, typically broken into sections, to find the best solution, (this is known as model based OPC). The objective is to reproduce, as well as possible, the original layout drawn by the designer in the silicon wafer. Generally, the pattern imparted to the radiation beam will correspond to a particular functional layer of a device such as an integrated circuit being created in the target portion.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may, but need not, be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
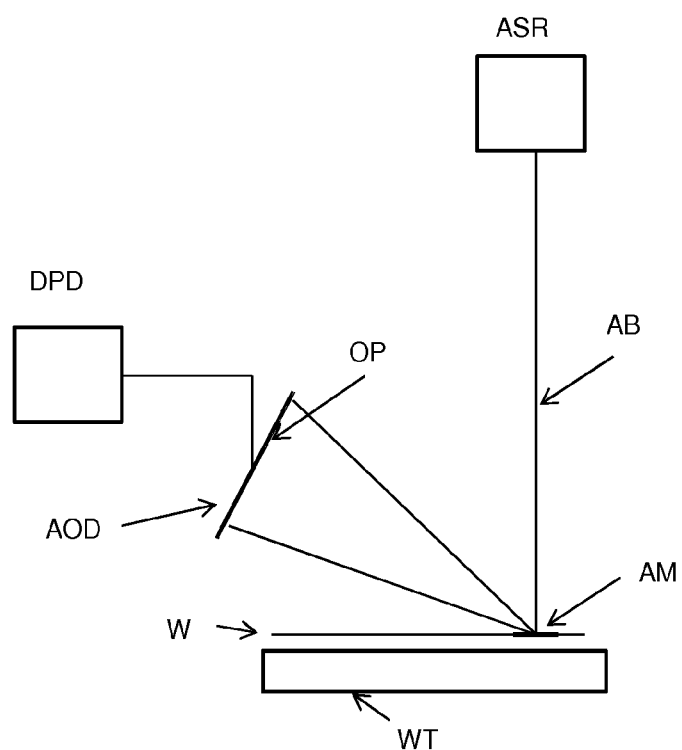
FIG. 2 depicts a highly schematic view of an alignment sensor in accordance with the invention that may be applied in the lithographic apparatus of FIG. 1.

FIG. 2 depicts a highly schematic view of a sensor (also referred to as alignment sensor) according to the invention as may be comprised in the lithographic apparatus of FIG. 1. A substrate table WT holds a substrate W having an alignment mark AM thereon. The alignment sensor comprises an alignment source of radiation ASR (also referred to as source of radiation or radiation source) configured to emit an alignment beam of radiation AB (also referred to as radiation beam) onto the substrate, and an alignment optical detector AOD (also referred to as detector) configured to detect the alignment beam having interacted with the alignment mark. The alignment sensor is configured to project the alignment beam AB having interacted with the alignment mark AM onto the alignment optical detector AOD as an out of focus optical pattern OP. The optical pattern OP may be considered a spatial distribution of the intensity (and possibly phase) of the radiation that is scattered towards the optical detector AOD. The alignment sensor further comprises a data processing device (or a data processing system) DPD connected to the alignment optical detector and being configured to receive image data representing the out of focus optical pattern as detected by the alignment optical detector, and process the image data to determine alignment information from the received image data. The data processing device may either calculate from the received image data a synthetically focused image, and determine alignment information from the calculated synthetically focused image, or may directly determine the alignment information from the received image data. In the latter case, the intermediate step of calculating the synthetically focused image from the received image data may be omitted and the alignment information being derived from the received image data.

The alignment sensor is applied to derive a position of an alignment mark. The alignment mark is provided on the substrate (also referred to as a wafer). It is noted that in this document the terms "substrate" and "wafer" are used interchangeably. The alignment mark may form an alignment grating or any other suitable alignment mark. A position of the alignment mark as sensed may be compared to a reference position or a position of the same alignment mark at a previous step in the wafer processing, and alignment of the wafer may be performed based on the measurement obtained from the alignment sensor. The alignment beam may be a laser beam or any other suitable optical beam such as a monochromatic beam (i.e., the radiation having substantially a single wavelength), a beam having a wavelength within a range of wavelengths, etc. The beam, having interacted with the alignment mark, e.g. by means of diffraction, scattering or any other suitable interaction, is detected by the alignment optical detector, such as an optical detector array, e.g. a CCD or CMOS optical detector array or any other suitable optical detector for detecting a spatial distribution of e.g., intensity or color, within the capturing area of the alignment optical detector.

In accordance with an embodiment of the invention, as described above with reference to FIG. 2, the alignment sensor projects the beam out of focus onto the alignment optical detector. The expression "out of focus" is to be understood as lacking focus to an extent that the alignment pattern is not sharply visible in the image itself as received by the alignment optical detector. In order to provide derive usable data from the out of focus optical pattern, a so called lensless imaging technique is applied. Attributes of incoming electromagnetic radiation (e.g., intensity, phase) of the out of focus optical image are detected and transformed into digital data that is thereupon subjected to operations in order to extract information from the radiation. That is, the lensless imaging may emulate in software an optical system. As the optical system is emulated in software, faults or aberrations as occur in an optical system using lenses, focusing mirrors, and/or other optical elements, may be omitted. Hence, in principle, the lensless optical imaging may emulate a theoretically ideal optics for acting on radiation of any wavelength.

The alignment sensor may make use of so called lensless optics. It is noted that the expression "lensless optics" may (however does not necessarily need to) refer to an optical imaging system that does not comprise any refractive or reflective optical component (such as a lens, a focusing mirror, etc.).

Using the alignment sensor in accordance with the invention, a large wavelength range may be covered. For example, an alignment beam wavelength range from 0.1 nanometers to 1500 nanometers may be envisaged. As the processing of the synthetic optical image in software does not or to a lesser degree suffer from wavelength-dependent aberrations, an absence or partial absence of such optical components (such as a transmissive lens, a focusing mirror, a polarizer, etc), a large wavelength range may be applied. Using such a large wavelength range, "hidden" alignment patterns, i.e. alignment patterns that are covered by further layers provided in the lithographic process, may be detected more easily, as it increases the likelihood that the further layers are transparent to at least some wavelengths occurring in the large wavelength range. The layers provided on top of the alignment mark may differ substantially in their optical transmission characteristic. For example, a layer comprising a film of metal may have different optical transmission characteristics for a specific wavelength than a layer of oxide. In the alignment sensor as described a large wavelength range may be applied. A likelihood that the layer or layers on top of the alignment pattern show a transparency for specific wavelengths may increase when using an alignment beam of a large wavelength range. That is, the chances that a particular wavelength is found that provides a sufficiently high transmission may increase when using the large wavelength range.

Using the lensless imaging algorithm, the optical imaging on the detector need only be such that the relevant attributes of the incident radiation can be captured that enable to convert the radiation into data for digitally emulating the theoretically ideal optical system. Accordingly, the detector AOD in FIG. 2 represents the interface between the physical domain and the optical domain. There may, but need not be, one or more optical elements in the radiation path from the mark AM to the detector.

The data processing device DPD may be formed by a separate data processing device, such as a microprocessor provided with suitable software instructions, or may be integrated into other data processing devices of the lithographic apparatus. In other words, the tasks performed by the data processing device may for example be implemented as tasks (processes) running on an existing data processing device of the lithographic apparatus. The alignment beam may be any suitable alignment beam, such as an (optical) laser beam. The alignment source of radiation may correspondingly be any suitable source of radiation, such as a laser. As the present development enables to operate the alignment beam over a wide wavelength range, e.g. ranging from UV to IR, a corresponding alignment source of radiation (providing a wide spectrum or having an adjustable wavelength) may be applied. The alignment mark may be any suitable alignment mark. For example the alignment marks may comprise diffractive alignment marks. Any other suitable alignment mark may be applied.

A variety of techniques have been devised that may be applied to obtain phase information, and/or to calculate the synthetically focused image, from the image as detected by the alignment optical detector, using the lensless imaging algorithm. Some examples are described below with reference to FIGS. 3, 4, 5A and 5B. It is noted that, although in each of those examples, a synthetic image is calculated, and the alignment information derived from the synthetic image, the step of calculating the synthetic image may be omitted, i.e. the alignment information may be directly derived instead of the synthetic image, using the lensless imaging algorithm.

Figure 3:
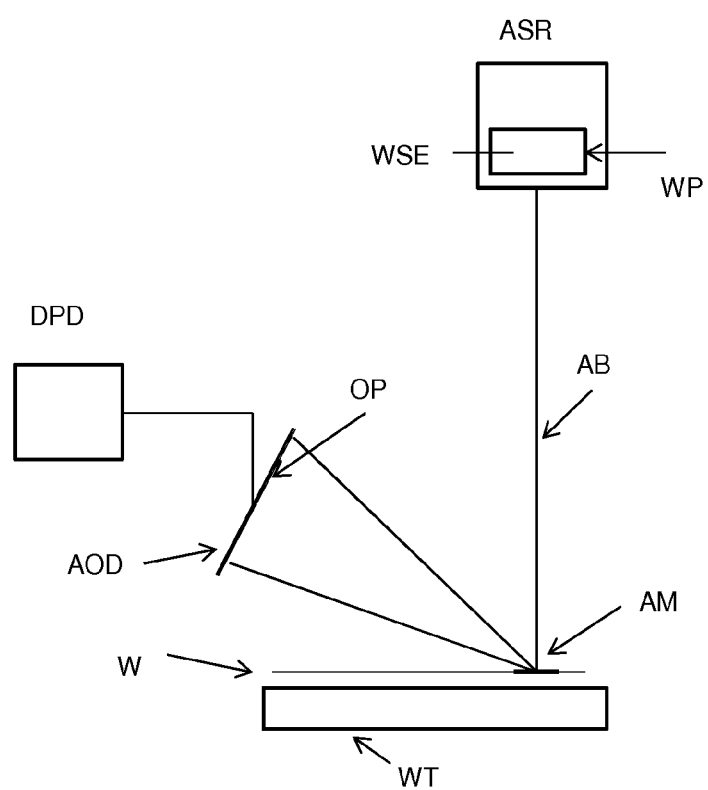
FIG. 3 depicts a highly schematic view of another alignment sensor.

In an embodiment, as schematically depicted in FIG. 3, the alignment source of radiation ASR comprises a wavelength selective element WSE configured to receive a wavelength parameter WP and to control a wavelength range of the alignment beam in response to the wavelength parameter WP. The data processing device DPD is then configured to calculate the synthetic image from the wavelength parameter and from the received image data for each wavelength parameter, i.e. from the received image data as a function of the wavelength parameter. As the optical image as received by the alignment optical detector will show a dependency on wavelength, this dependency may be used to derive phase information and thereby to calculate the synthetically focused image. For example, a change in the wavelength may translate into a change in the optical pattern as detected by the alignment optical detector, as the changing wavelength—at unchanged optical paths—results in a change of mutual phases between interfering beam parts. The wavelength parameter WP may be provided by any suitable parameter, such as an analogue or digital signal representative of a numerical value of the wavelength in nanometers. The wavelength selective element may be any suitable optical element, such as a controllable filter, e.g. a controllable (e.g. tunable) band pass optical filter or a controllable (tunable) narrowband optical filter.

Figure 4:
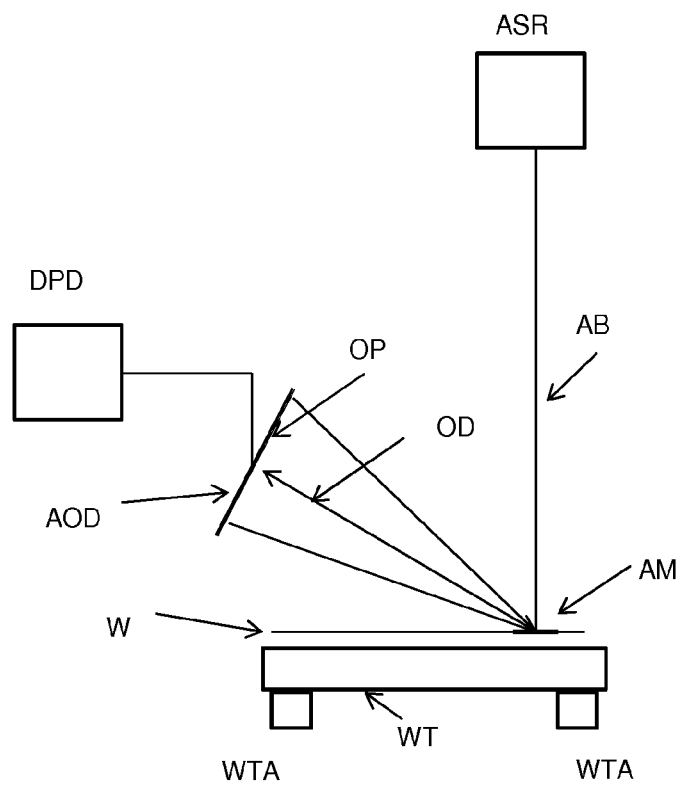
FIG. 4 depicts a highly schematic view of yet another alignment sensor.

In an embodiment, as schematically depicted in FIG. 4, the lithographic apparatus is configured to move the substrate table and the alignment optical detector relative to each other so as to alter an optical distance OD between the substrate W held by the substrate table and the alignment optical detector AOD, the data processing device being configured to calculate the synthetic image from the optical distance and from the received image data for each optical distance, i.e. from the received image data as a function of the optical distance. Accordingly, by altering the optical distance, the unfocussed image on the alignment optical detector changes, which is used to derive phase information. The phase information may be obtained from the change of the image as detected by the alignment optical detector in relation to the change in the optical distance. This technique may be applied with a monochromatic beam as well as with a wideband beam. Displacing the substrate by moving the substrate table in a direction perpendicular to the surface of the substrate (generally a vertical direction) may be performed by substrate table actuators WTA, which may for example be formed by the substrate table positioner WP (as depicted in FIG. 1), so that no additional hardware in terms of displacement actuators may be required. Alternatively, or in addition to the displacement of the substrate table in vertical direction, the substrate table may also be moved in horizontal direction in order to alter the optical distance.

In an embodiment, the data processing device is configured to calculate the synthetic image using an iterative reconstruction algorithm. Based on an initial assumption, an initial synthetic image may be calculated. Using a step by step approach, the calculated image may iterate towards the synthetic image. The calculation of the synthetic image using an iterative reconstruction algorithm works as follows. One collects a set of constraints that the pattern must fulfill, by means of measurements, or by means of prior knowledge (such as when one knows what pattern the alignment mark will have). The reconstruction solution will meet all these constraints. Hence one can think of this reconstruction problem as a feasibility problem, in which a possible solution that satisfies all these constraints is identified. Identifying a solution to this feasibility problem can be done by means of a alternating projection algorithm, in which the candidate solution is projected (orthogonally in a high dimensional space) onto each constraint one by one. When the candidate solution satisfies all constraints (sufficiently) one can terminate the algorithm.

Figure 5A:
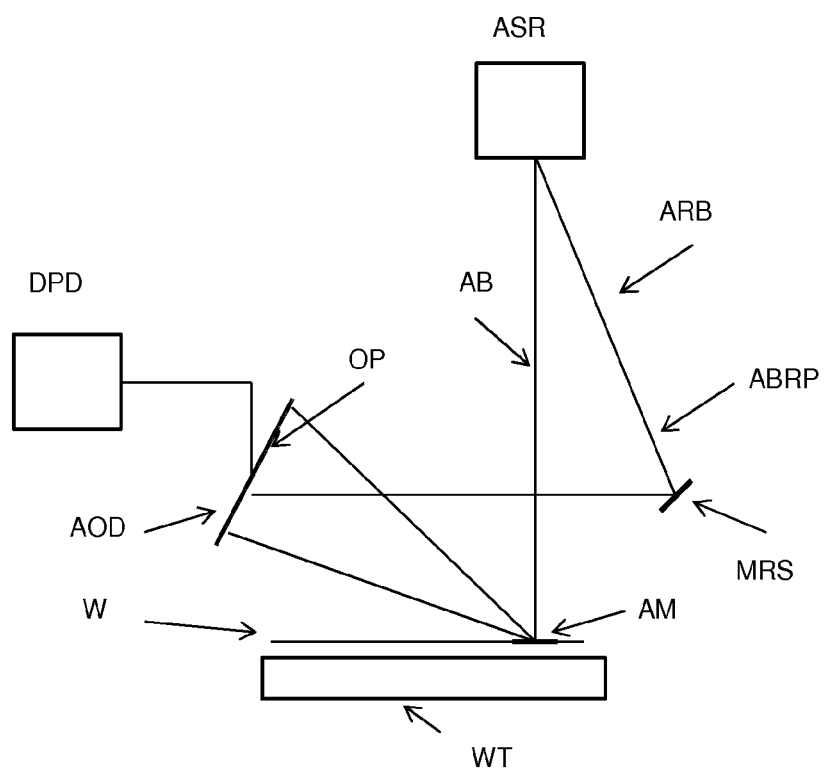
FIG. 5A-5B depict a highly schematic view of yet further alignment sensors

In an embodiment, as schematically depicted in FIG. 5A, the alignment sensor further comprises an alignment beam reference path ABRP configured to provide an alignment reference beam ARB, the alignment reference beam to interact with the alignment beam AB at the alignment optical detector AOD, the data processing device DPD being configured to calculate the synthetic image from the received image data, the received image data resulting from the interaction of the alignment beam and the alignment reference beam. Accordingly, as the interaction between the alignment reference beam and the alignment beam at the alignment optical detector depends on a phase of the alignment beam at the alignment optical detector, phase information may be derived therefrom. The synthetically focused optical image may be calculated therefrom, examples being provided below. In the first example an optical length changes of the reference path, along which the reference beam propagates. In the second example a wavelength of the reference beam changes.

In the first example, as schematically depicted in FIG. 5A, the alignment beam reference path ABRP comprises a movable reference structure MRS. The alignment sensor is configured to move the reference structure MRS so as to alter an optical length of a propagation path of the reference beam ARB. The data processing device DPD is configured to calculate the synthetic image from the optical length and from the received image data for each optical length. The phase information may be derived from the changes in the optical signal detected by the alignment beam optical detector as a result of the changes in the optical length of a propagation path of the reference beam ARB, and thus of the phase of the reference beam incident on the alignment optical detector (as, given a varying optical path length, the phase at the alignment optical detector will change as a function of the optical path length).

Figure 5B:
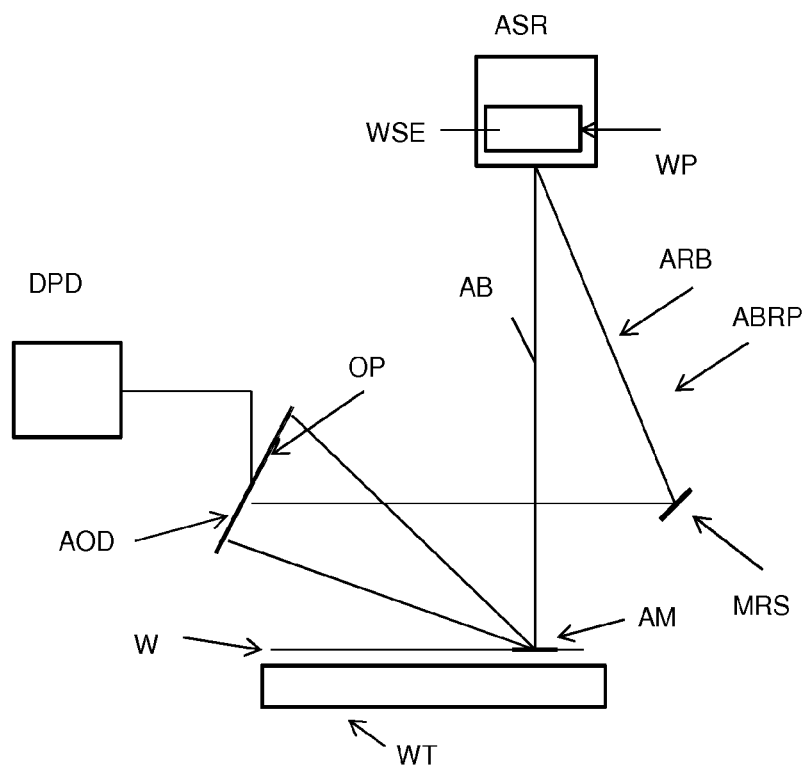

In the second example, as schematically depicted in FIG. 5B, the alignment source of radiation ASR comprises a wavelength selective element WSE configured to receive a wavelength parameter WP and to control a wavelength range of the alignment beam in response to the wavelength parameter WP. The data processing device DPD is configured to calculate the synthetic image from the wavelength parameter and from the received image data for each wavelength parameter, i.e. from the received image data as a function of the wavelength parameter. The phase information may be derived from the changes in the optical signal detected by the alignment beam optical detector as a result of the changes in the wavelength of the reference beam ARB, and thus of the phase of the reference beam incident on the alignment optical detector (as, given a fixed optical path length, the phase at the alignment optical detector will change as a function of the wavelength).

In an embodiment, the data processing device is configured to correlate the synthetic image with an expected image representing the alignment mark and to derive alignment information from a result of the correlation. The expected image represents an image that would have been expected, knowing a shape, optical characteristics and approximate position of the alignment mark on the substrate. A correlation may be determined for various possible positions of the alignment mark on the substrate, whereby the highest correlation may provide information about the one of the possible positions that would most closely correspond to a position of the alignment mark. This process may be performed in an iterative way thereby to increase accuracy of determination of a position of the alignment mark on the substrate. This correction also be performed with an only partly synthetically focused, i.e. not perfectly focused synthetic image. Additional filtering may for example be applied thereto. In case of a partly (optically) focused image, it can be refocused digitally if the phase has been retrieved. If this cannot be done, the correlation peak is not as strong but the alignment can still be done (with a lower accuracy). It is noted that, alternatively, instead of the iterative reconstruction, a so called "matched filter" algorithm may be applied.

In an embodiment, the alignment sensor does not comprise a focusing optical element (such as a lens or a mirror) in an optical path from the alignment mark to the alignment optical detector.

A possible embodiment using the computational optics is described below in more detail with reference to FIGS. 6-8.

FIG. 6 shows schematically an alignment sensor for performing alignment measurement. A modified form of "lensless imaging" or coherent diffractive imaging (CDI) is used. CDI, which is related also to digital holography, is a technique that has been proposed for use in microscopy. In the present disclosure, the CDI technique is adapted to perform alignment on diffractive structures, for example measurement of asymmetry of grating structures. The alignment sensor, while not necessarily being completely lensless, avoids the need for the very complicated high-NA, wideband objective lens and other optical elements, required to meet performance requirements in future applications.

The alignment sensor of FIG. 6(a) comprises a radiation source 611 and an image sensor 623. Radiation source 611 in this example supplies a beam 630 of spatially coherent radiation. Source 611 may be formed by one or more narrowband (monochromatic) laser sources, in which case the radiation will be both spatially coherent and temporally coherent. Alternatively, and assumed in the present example, source 611 may be a broadband source which is spatially coherent, with a low temporal coherence. Such a source may be a so-called supercontinuum source or "white light laser". Source 611 may be supplemented with other devices in an illumination system 612 to deliver the beam 630 in a desired form. For example the source 611 and illumination system in some embodiments may include a wavelength selector 613 (shown dotted). Such a wavelength selector may be for example, an acousto-optic tunable filter (AOTF).

Image sensor 623 can be a CCD or CMOS sensor. Different illumination modes can be implemented by providing an aperture device, a programmable spatial light modulator, or spatially distributed fibers.

In an illumination path from source 611 to target T, an illumination optical system comprises a simple mirror 640 and low-NA lens 642. Lens 642 focuses illuminating radiation beam 630 into a spot S at the location of alignment target T on substrate W. A positioning system (similar for example to the positioning system PW in the lithographic apparatus LA) brings the substrate W and target T to the focal point of beam 630. The spot may have a similar size and shape of for example roughly a circle of diameter in the range 10 to 80 μm, for example 20 to 50 μm or around 40 μm. In an embodiment where the illuminating radiation beam 630 is incident at an oblique angle as shown, the spot S may be non-circular, or anamorphic optics can be applied to achieve a circular spot. Radiation 646 reflected by the target (diffracted at zero order) is illustrated for simplicity as being dumped at 648. In a practical embodiment, the reflected (zero order) radiation can be used, for example to determine the focus position of the substrate as part of a position control mechanism. Radiation 650 comprising a desired portion of the radiation scattered by the target T is collected by sensor 623. No high-NA objective lens is required in order to collect the object radiation, and the radiation can pass directly from target to sensor. In a practical example, a simple collection optical system may be provided, for at least roughly collimating the beam (reducing divergence). Such a collection optical system, which may be a simple lens, is shown schematically in the inset diagram at (b). Nevertheless, the complex high-NA objective lens is eliminated. The illuminating radiation can be directed directly at the target area, bypassing the collection optical system. This helps to avoid noise caused by scattering of the illuminating radiation within elements of the optical system.

In addition to the collected scattered radiation 650, reference radiation 652 is also delivered to the sensor 623. The scattered radiation 650 and reference radiation 652 are derived from the same source 611 so as to be coherent with one another and consequently form an interference pattern at the sensor, depending on their relative phases at each pixel on the sensor. In the illustrated example, reference radiation 652 is obtained by splitting off a portion of the illuminating radiation 630 with a beam splitter 654 and delivering it to the sensor via a movable mirror 656, a diverging lens 658 and a folding mirror 660. The reference radiation 650 floods the image sensor 623 with a "reference wave" having a relatively uniform amplitude across the field of sensor 623. The reference wave travels in a direction oblique to an optical axis of the system at a well-defined angle, and so the reference wave has a well-defined amplitude and phase. The scattered radiation 650, which may be referred to as the object wave, has unknown amplitude and phase.

As an alternative to splitting off a portion of the illuminating radiation to form a reference wave, so-called "self-referencing" arrangements are also possible. In that case, a portion the higher order scattered field itself is split off and used as a reference wave. For instance, a self-referencing arrangement may work by interfering a sheared copy of the scattered field with the scattered field.

As will be explained further below, interference between the reference wave and the object wave gives a resulting intensity distribution on the sensor 623 that can be used by processor PU to calculate the complex radiation field of the scattered object wave ("complex" here meaning both amplitude and phase). Image data 662 is delivered to processor PU, representing one or more of these captured intensity distributions. Wave propagation algorithms can then be used to calculate a synthetic image, without the need for imaging optics.

Is it not essential that the reference wave is at an oblique angle. However, by using an oblique angle one can introduce a fringe pattern across the target that has a high spatial frequency and can be used to "determine" the phase information from a single image acquisition. The angle of the reference wave must not be too large, for example less than the wavelength divided by twice the pixel array pitch (lambda/2*pixel size). In a typical set-up, 3-4 degrees may be sufficient, for example. Without this high-frequency fringe pattern, one can obtain the phase information for example by "phase-stepping". As described below, one method for phase stepping is where one acquires multiple images while varying the relative phase of the reference beam. While this can be done, it puts rather severe demands on the stability of the set-up, and the oblique reference beam can therefore be advantageous. In other methods, phase stepping can be done by spatial modulation, such that different phase steps are found within a so-called 'super-pixel'. The term super-pixel may be understood as a collection of pixels, for example based on their neighborhood, or phase, or amplitude, or intensity, or correlation, etc.

The sensor placement and the pitch of its array of pixels should be determined such that the pixel array provides adequate sampling of the interference pattern. As a rough guide, the pixel spacing (pitch) should be less than for example λ/2d, where λ, is the (longest) wavelength in the illuminating radiation 630 and d is the spacing from target T to image sensor 623. In a practical example, the spacing d may be of the order of 1 cm. The sensor dimension may be several times d in each direction (X and Y), for example five or more times d, ten times d or even larger. In this regard, it will be noted that the drawings of FIGS. 6 and 7 are very much distorted in scale, to allow a clear depiction of the optical system. The sensor in practice may be very much closer to the target, or very much wider in extent, than the drawings suggest. For example, the sensor may have a distance d and extent L such that it subtends a relatively wide angle θ when seen from the target T. The angle θ may be over 100 degrees in each dimension, for example over 135 degrees, and for example around 150 degrees. As illustrated in the inset FIG. 6(b), a simple collimating lens 664 can be used to increase the physical distance to the sensor, while still capturing a large range of angles of scattered radiation. The extent of the sensor does not need to be centered over the target as shown. It merely needs to be positioned to capture the desired diffraction orders, based on the angle of incidence of the illuminating radiation, the wavelength(s) of the illuminating radiation and the pitch of the periodic grating.

Variations are possible, for example in the delivery of the reference wave. In the illustrated example, the movable mirror 656 can be used for path length compensation, adjusting the optical path difference between the object wave and the reference wave. If the source 611 is a broadband source such as a white light laser, then stepping with the mirror allows a spectroscopic measurement of the complex radiation field over a large wavelength range. Since the coherence length of a broadband source is relatively small, the apparatus may operate by capturing images while stepping through a wide range of positions. Only some of those positions, corresponding to path length differences close to zero, will be within the coherence length. Other positions will not yield a complex field image. Note that the path length difference may be different at different locations on the sensor, at a given position of the mirror 656. Consequently, each point in the sampled far field will have a maximum fringe contrast at a different position of the mirror. In order to calculate the phase and/or amplitude for a specific wavelength, one could still need to include the information from multiple images in the calculations. In case of low-coherence sources, one will get a contrast variation across the image. This could be calibrated with a test measurement on a test target.

In addition to relaxing design challenges for a given size of image field, the elimination of the complex objective lens allows a larger fields of view to be implemented that would simply be impossible with conventional optics. Instead of a 2×2 array of gratings, for example, a composite target could be imaged with 5×2 or even 5×4 gratings within the field of view.

In order to obtain unambiguous complex radiation field information, the steps of movable mirror 656 can be made much smaller than a (longest) wavelength of the illuminating radiation. In measurement of targets in high-volume manufacturing examples such as semiconductor device manufacturing, the time taken per measurement is critical, but also includes not only the time take for image capture itself but also the time for moving and acquiring each target, prior to image capture. Once the target is acquired, to capture multiple images while stepping the moving mirror 656 may not add significantly to the overall alignment measurement time. The number of steps taken may therefore be quite large in practice, even if many of the captured images contribute little or nothing in the subsequent analysis. Also, if a larger field of view is obtained, more individual gratings or other target structures can be measured in one capture operation.

In other examples, phase stepping can be realized without moving parts such as movable mirror 656. For example, a reflective or transmissive spatial light modulator could be provided with different phase steps at different pixel positions within larger 'superpixels'. Different phase steps could be implemented by etching steps into a suitable material, or by more exotic means. A spatial light modulator based on, for example, liquid crystal, could be used to modulate the phase. In other examples, the wavelength of the reference wave can be varied instead of or in addition to its path length. Provided the wavelength and incidence angle is known, the complex radiation field can be calculated. Wavelength selection can be made by inserting filters in the illumination path, and/or by selecting different radiation sources, or tuning a tunable source.

In other words, phase information can be obtained by varying path length difference with a constant wavelength, by varying wavelength with a constant path length difference, or by a combination of both variations. Wavelength selection can be applied after scattering, if desired. For example wavelength-selecting filters can be inserted in front of image sensor 623 and changed between captures. Multiple image sensors 623 could be provided, with the collection path being split by wavelength-selecting beam splitters. Different pixels within the same image sensor 623 can be made sensitive to different wavelengths, for example in the manner of RGB filter arrays on a single-chip color image sensor.

FIG. 7 shows another variation. Most parts are similar to those illustrated in FIG. 6 and the same reference signs are used. The main difference is that the reference radiation 652 is not taken directly from the illuminating radiation 630 but is taken by mirror 670 from the zero order radiation 646 reflected by target T. This variation may or may not simplify the optical layout. A benefit of this variation is that the scattered radiation 650 (object wave) and the reference radiation 652 (reference wave) will be subject to the same influences over a greater portion of their respective optical paths. In particular, any vibrations experience by the target relative to the optical system will influence both the reference wave and the object wave substantially equally. Therefore the influence of these vibrations on the recorded complex field will be reduced. The reference wave in this arrangement will carry some information about the target structure, but this will be only average information, and the reference wave is still effective as a phase reference for the purpose of measuring the complex radiation field of the object wave.

Figure 8:
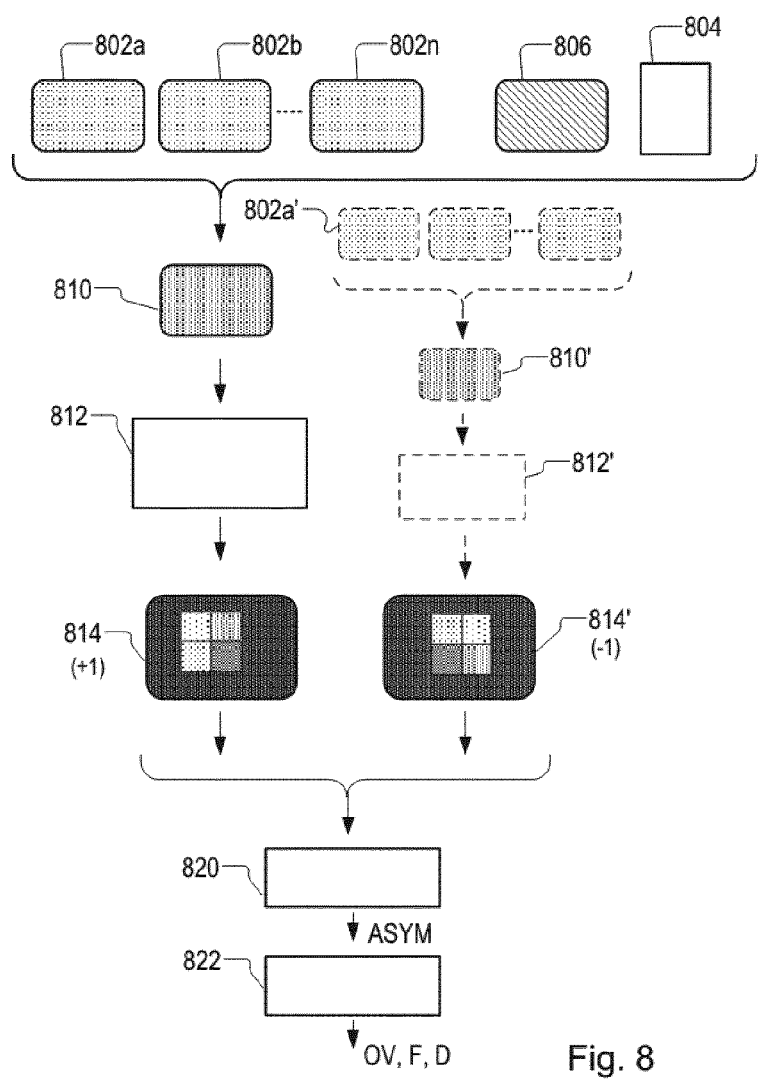
FIG. 8 depicts a flow diagram illustrating an operation of the alignment sensor in accordance with FIGS. 6 and 7.

FIG. 8 illustrates the complete measurement process using the apparatus of FIG. 6 or 7. The process is implemented by operation of the optical hardware illustrated in the drawings, in conjunction with processor PU. An example using the lensless imaging algorithm is described. Functions of (i) controlling the operations of the hardware and (ii) processing the image data 662 may be performed in the same processor, or may be divided between different dedicated processors. Processing of the image data need not even be performed in the same apparatus or even in the same country.

At 802a, 802b, . . . 802n a set of intensity distribution images are captured and received by processor PU from the image sensor 623. Also received is auxiliary data (metadata) 804 defining operating parameters of the apparatus associated with each image, for example the illumination mode, position of mirror 656 and the like. This metadata may be received with each image, or defined and stored in advance for the set of images. The metadata may also include information of the substrate and target structure. Also received or previously stored is reference wave specification 806 defining the known phase of the reference wave as it varies across image sensor 623. The absolute phase does not need to be known as long as you accurately know the relative phase steps across the image sensor, and/or relative to an arbitrary initial position of the movable mirror. Additional calibration procedures can be provided to obtain this information, rather than relying on design and calculation alone.

From the received image data 802a etc., the metadata 804 and the reference wave specification 806, processor PU calculates a complex radiation field 810. This is a representation of amplitude and phase of the object wave (scattered radiation 650) across the image sensor 623. The representation may be expressed in the form of amplitude and phase values per pixel position. Other equivalent forms of expression are also available. From this complex radiation field, processor PU in a process 812 can use wave propagation algorithms to calculate a synthetic image 814 as it would be seen if focused by an ideal optical system onto an image sensor (similar to sensor 623 of FIG. 6).

As illustrated schematically in FIG. 8, synthetic image 814 can have the same form as the real image. Dark and light rectangles corresponding to each individual grating in a composite target are shown, just by way of example. The synthetic image may be an image of intensity, analogous to the real images captured in the known apparatus. However, the synthetic image does not necessarily have to be an intensity image. It can also be a phase image of the grating, or both intensity and/or amplitude and phase images can be calculated. As already discussed above, two such images can be used to calculate asymmetry of each grating, if the two images are produced using opposite portions of a diffraction spectrum of the target. In FIG. 8 a second synthetic image 814' is shown. It will be understood that the second synthetic image is obtained by the same process as image 814, based on a second set of images 802a', etc. that are captured using image sensor 623 when the illumination profile or orientation of the target has been rotated 180 degrees. In other words, the synthetic image 814 is be produced using (for example) +1 order diffracted radiation, while synthetic image 814' is produced using −1 order diffracted radiation.

At step 820 processor PU compares intensities of the images of different gratings in the images 814 and 814' to obtain asymmetry measurements of each grating. At step 822 the measured asymmetries of the multiple gratings within composite target are converted by a predetermined formula and/or calibration curves to obtain a measurement of a parameter of interest, such as overlay OV, focus F or dose D. The formulae are derived from knowledge of the target structures, including the bias scheme applied. Calibration curves may be obtained by comparing asymmetry measurements on a range of targets with measurements of the parameter of interest made by other techniques such as electron microscopy (SEM, TEM).

The illustrated process is repeated for all targets of interest. Note that the computational parts of the process can be separated in time and space from the image capture. The computations do not need to be completed in real time, although of course that would be desirable. Only the capturing of the images need 802a etc. requires the presence of the substrate, and so impacts productivity throughput) of the lithographic device manufacturing process overall.

As mentioned above, the number of images 802a captured may be greater than the number selected and used to calculate the complex radiation field. The number used can be selected according to requirements. In principle, four images captured with different (known) phase steps between the object wave and the reference wave should be sufficient to obtain unambiguous amplitude and phase information. Alternatively, four images captured with different (known) wavelengths of illuminating radiation 630 would be sufficient. Greater numbers can be used to improve measurement certainty. The number of images required for the calculation may be reduced if the calculation can be constrained using knowledge of the target structure and substrate. Phase stepping algorithms are known which are proven to be more robust to noise. For example five-step phase shifting algorithms are more robust to phase shifter calibrations. Multi-step algorithms exist which do not require the knowledge of the phase step as long it is identical. Random phase step algorithms also exist. See for example, James C Wyant, "Phase Shifting Interferometry.nb.pdf", Optics 513 Chapter 5, Chapter Notes, 2011 available at _http://fp.optics.arizona.edu/jcwyant/Optics513/ChapterNotes/Chapter05/Notes/Phase%20Shifting%20Interferometry.nb.pdf.

In the above examples the steps of calculating the complex field 810 and calculating the synthetic image 814 are shown as separated sequentially. This is likely to be a convenient way to proceed in practice. In principle, however, the calculations could be merged so that one proceeds by a single calculation directly from the captured images 802a etc. to the synthetic image 814, without explicitly calculating the complex field. The claims should not be interpreted as requiring explicit calculation of the complex field as a distinct array of data.

In addition to calculating synthetic images of the target as it would be seen by image sensor 623 of the known dark-field imaging scatterometer, the apparatus can calculate synthetic images of the diffraction pattern as it would be seen in a pupil image sensor. Unlike the known apparatus, no splitting of the collected radiation into different optical branches is required to obtain these different images.

The lensless imaging algorithm and the deriving of the alignment information may employ software or other suitable programming such as the programming of a signal processor, the programming of a gate array, etc. The software may be executed on any suitable data processor, such as a microcontroller, microprocessor, digital signal processor, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a substrate table constructed to hold a substrate; and
a sensor configured to sense a position of an alignment mark provided onto the substrate held by the substrate table,
wherein the sensor comprises:
a source of radiation configured to illuminate the alignment mark with a radiation beam,
a detector configured to detect the radiation beam, having interacted with the alignment mark, as an out of focus optical pattern, and
a data processing system configured to:
receive image data representing the optical pattern, and
convert the received image data into data for digitally emulating an optical system to determine alignment information,
wherein the radiation beam, having interacted with the alignment mark, propagates along an optical propagation path to the detector comprising an absence of a focusing optical element,
wherein the optical propagation path is a lensless optical propagation path.

2. The lithographic apparatus of claim 1, wherein the data processing system is configured to convert the received image data into data for digitally emulating an optical system to determine alignment information by being configured to:
calculate, from the received image data, a synthetically focused image; and
determine the alignment information from the calculated synthetically focused image.

3. The lithographic apparatus of claim 1, wherein the source of radiation comprises:
a wavelength selective element configured to receive a wavelength parameter and to control a wavelength range of the radiation beam in response to the wavelength parameter, the data processing system being configured to calculate the synthetically focused image from the received image data as a function of the wavelength parameter.

4. The lithographic apparatus of claim 1, wherein:
the lithographic apparatus is configured to move the substrate table and the detector in respect of each other so as to alter an optical distance between the substrate held by the substrate table and the detector, and
the data processing system being configured to determine the alignment information from the received image data as a function of the optical distance.

5. The lithographic apparatus of claim 4, wherein the data processing system is configured to determine the alignment information from the received image data by determining the synthetic image from the received image data and to determine the alignment information from the synthetic image.

6. The lithographic apparatus of claim 1, wherein the data processing system is configured to determine the alignment information using an iterative reconstruction algorithm.

7. The lithographic apparatus of claim 1, wherein:
the sensor further comprises a radiation beam reference path configured to provide a reference beam to interact with the radiation beam at the detector,
the data processing system being configured to determine the alignment information from the received image data, and
the received image data resulting from the interaction of the radiation beam and the reference beam.

8. The lithographic apparatus according to claim 7, wherein:
the radiation beam reference path comprises a movable reference structure,
the sensor being configured to move the reference structure so as to alter an optical length of a propagation path of the reference beam, and
the data processing system being configured to determine the alignment information from the received image data as a function of the optical length.

9. The lithographic apparatus of claim 7, wherein:
the source of radiation comprises a wavelength selective element configured to receive a wavelength parameter and to control a wavelength range of the radiation beam in response to the wavelength parameter, and
the data processing system being configured to determine the alignment information from the received image data as a function of the wavelength parameter.

10. The lithographic apparatus of claim 1, wherein the data processing system is configured to correlate and/or filter the synthetic image with an expected image representing the alignment mark and to derive alignment information from a result of the correlation and/or filtering.

11. The lithographic apparatus of claim 1, wherein the sensor comprises an absence of an optical element in an optical path of the radiation beam from the alignment mark to the detector.

12. The lithographic apparatus of claim 1, wherein the source of radiation comprises one or more spatially coherent radiation sources.

13. The lithographic apparatus of claim 1, wherein the source of radiation comprises a supercontinuum source.

14. The lithographic apparatus of claim 1, wherein the source of radiation comprises a tunable radiation source.

15. A lithographic alignment method comprising:
    emitting a radiation beam onto an alignment mark on a substrate,
    detecting by a detector the radiation beam having interacted with the alignment mark, wherein the radiation beam having interacted with the alignment mark is projected onto the detector as an out of focus optical pattern, receiving, from the detector, image data representing the out of focus optical pattern, and
    converting the received image data for digitally emulating an optical system to determine alignment information,
    wherein the radiation beam, having interacted with the alignment mark, propagates along an optical propagation path to the detector comprising an absence of a focusing optical element,
    wherein the optical propagation path is a lensless optical propagation path.

16. A data processing system comprising:
    a data input configured to receive, from a detector, an out of focus optical pattern, the out of focus optical pattern from a radiation beam having interacted with an alignment mark,
    wherein the data processing system is configured to:
        receive at the data input image data representing the out of focus optical pattern, and
        convert the received image data into data for digitally emulating an optical system to determine alignment information,
    wherein the radiation beam, having interacted with the alignment mark, propagates along an optical propagation path to the detector comprising an absence of a focusing optical element,
    wherein the optical propagation path is a lensless optical propagation path.

* * * * *